(12) United States Patent
Wei et al.

(10) Patent No.: US 9,161,135 B2
(45) Date of Patent: Oct. 13, 2015

(54) THERMOACOUSTIC CHIP

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 17 days.

(21) Appl. No.: 13/930,510

(22) Filed: Jun. 28, 2013

(65) Prior Publication Data

US 2014/0140549 A1 May 22, 2014

(30) Foreign Application Priority Data

Nov. 20, 2012 (CN) .................. 2012 1 04711944

(51) Int. Cl.
*H04R 25/00* (2006.01)
*H04R 23/00* (2006.01)
*B82Y 30/00* (2011.01)

(52) U.S. Cl.
CPC .............. *H04R 23/00* (2013.01); *H04R 23/002* (2013.01); *B82Y 30/00* (2013.01); *H01L 2924/15153* (2013.01)

(58) Field of Classification Search
CPC ........... H04R 23/002; H04R 2201/028; H04R 2499/11; H04L 2924/15153
USPC ................................ 381/164, 394
See application file for complete search history.

(56) References Cited

U.S. PATENT DOCUMENTS

| | | | |
|---|---|---|---|
| 7,876,912 B2 | 1/2011 | Liu et al. | |
| 7,881,157 B2 * | 2/2011 | Watabe et al. | 367/140 |
| 8,059,841 B2 | 11/2011 | Jiang et al. | |
| 8,208,661 B2 | 6/2012 | Jiang et al. | |
| 8,300,855 B2 | 10/2012 | Liu et al. | |
| 8,494,187 B2 | 7/2013 | Jiang et al. | |
| 8,553,912 B2 | 10/2013 | Wang et al. | |
| 2005/0201575 A1 | 9/2005 | Koshida et al. | |
| 2006/0043576 A1 | 3/2006 | Lee | |
| 2006/0233388 A1 | 10/2006 | Liow et al. | |
| 2008/0170727 A1 * | 7/2008 | Bachman et al. | 381/174 |
| 2009/0268563 A1 * | 10/2009 | Jiang et al. | 367/140 |
| 2010/0067714 A1 | 3/2010 | Cheng | |
| 2010/0086166 A1 | 4/2010 | Jiang et al. | |
| 2010/0166232 A1 * | 7/2010 | Liu et al. | 381/164 |

(Continued)

FOREIGN PATENT DOCUMENTS

| | | |
|---|---|---|
| CN | 101771920 | 7/2010 |
| CN | 102307715 | 1/2012 |

(Continued)

*Primary Examiner* — Curtis Kuntz
*Assistant Examiner* — Ryan Robinson
(74) *Attorney, Agent, or Firm* — Novak Druce Connolly Bove + Quigg LLP

(57) ABSTRACT

A thermoacoustic chip includes a substrate, a sound wave generator, a first electrode, and a second electrode, and an integrated circuit chip. The substrate has a first surface. The sound wave generator is located on the first surface of the substrate. The first electrode and a second electrode are spaced from each other and electrically connected to the sound wave generator. The integrated circuit chip is located on the substrate and electrically connected to the first electrode and the second electrode.

16 Claims, 14 Drawing Sheets

(56) References Cited

U.S. PATENT DOCUMENTS

| | | | |
|---|---|---|---|
| 2010/0203929 A1 | 8/2010 | Skagmo et al. | |
| 2010/0260357 A1 | 10/2010 | Liu et al. | |
| 2010/0311002 A1 | 12/2010 | Jiang et al. | |
| 2011/0033069 A1 | 2/2011 | Liu et al. | |
| 2011/0051961 A1* | 3/2011 | Jiang et al. | 381/164 |
| 2011/0054659 A1 | 3/2011 | Carlson et al. | |
| 2012/0250907 A1 | 10/2012 | Jiang et al. | |
| 2012/0250908 A1* | 10/2012 | Jiang et al. | 381/164 |
| 2013/0126991 A1* | 5/2013 | Ehrenpfordt et al. | 257/416 |
| 2013/0129119 A1 | 5/2013 | Miyatake et al. | |
| 2013/0216074 A1 | 8/2013 | Kon | |

FOREIGN PATENT DOCUMENTS

| | | |
|---|---|---|
| JP | 11-300274 | 11/1999 |
| JP | 2005-57479 | 3/2005 |
| JP | 2005-057495 | 3/2005 |
| JP | 3808493 | 5/2006 |
| JP | 2008-167252 | 7/2008 |
| JP | 2009-141880 | 6/2009 |
| JP | 2010-74831 | 4/2010 |
| JP | 2010-93804 | 4/2010 |
| JP | 2010-288270 | 12/2010 |
| JP | 2011-41269 | 2/2011 |
| JP | 2012-039272 | 2/2012 |
| JP | 2012-39272 | 2/2012 |
| JP | 2012-94942 | 5/2012 |
| JP | 2012-209923 | 10/2012 |
| TW | 209093 | 7/1993 |
| TW | I246735 | 1/2006 |
| TW | M299999 | 10/2006 |
| TW | 200644701 | 12/2006 |
| TW | I273715 | 2/2007 |
| TW | 200725861 | 7/2007 |
| TW | 200743677 | 12/2007 |
| TW | 201002097 | 1/2010 |
| TW | 201018256 | 5/2010 |
| TW | 201029481 | 8/2010 |
| TW | 201043763 | 12/2010 |
| TW | 201118938 | 6/2011 |
| TW | 201125373 | 7/2011 |
| TW | 201143474 | 12/2011 |
| TW | I356396 | 1/2012 |
| TW | 201240480 | 10/2012 |

* cited by examiner

THERMOACOUSTIC CHIP

RELATED APPLICATIONS

This application claims all benefits accruing under 35 U.S.C. §119 from China Patent Application No. 201210471194.4, filed on Nov. 20, 2012 in the China Intellectual Property Office.

BACKGROUND

1. Technical Field

The present disclosure relates to a thermoacoustic chip, especially a thermoacoustic chip based on carbon nanotubes.

2. Description of Related Art

In traditional speakers, sounds are produced by mechanical movement of one or more diaphragms.

In one article, entitled "The thermophone as a precision source of sound" by H. D. Arnold and I. B. Crandall, Phys. Rev. 10, pp22-38 (1917), a thermophone based on the thermoacoustic effect is disclosed. The thermophone in the article includes a platinum strip used as sound wave generator and two terminal clamps. The two terminal clamps are located apart from each other, and are electrically connected to the platinum strip. The platinum strip has a thickness of 0.7 micrometers. Frequency response range and sound pressure of sound wave are closely related to the heat capacity per unit area of the platinum strip. The higher the heat capacity per unit area, the narrower the frequency response range and the weaker the sound pressure. An extremely thin metal strip such as a platinum strip is difficult to produce. For example, the platinum strip has a heat capacity per unit area higher than $2 \times 10^{-4}$ J/cm$^2$*K. The highest frequency response of the platinum strip is only $4 \times 10^3$ Hz, and the sound pressure produced by the platinum strip is also too weak and is difficult to be heard by human.

In another article, entitled "Flexible, Stretchable, Transparent Carbon Nanotube Thin Film Loudspeakers" by Fan et al., Nano Letters, Vol. 8 (12), 4539-4545 (2008), a carbon nanotube speaker is disclosed. The carbon nanotube speaker includes a sound wave generator. The sound wave generator is a carbon nanotube film. The carbon nanotube speaker can produce a sound that can be heard because of a large specific surface area and small heat capacity per unit area of the carbon nanotube film. The frequency response range of the carbon nanotube speaker can range from about 100 Hz to about 100 KHz. However, carbon nanotube speakers are not convenient for use.

What is needed, therefore, is to provide a carbon nanotube speaker which is convenient for use.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the thermoacoustic chips.

Figure 1:
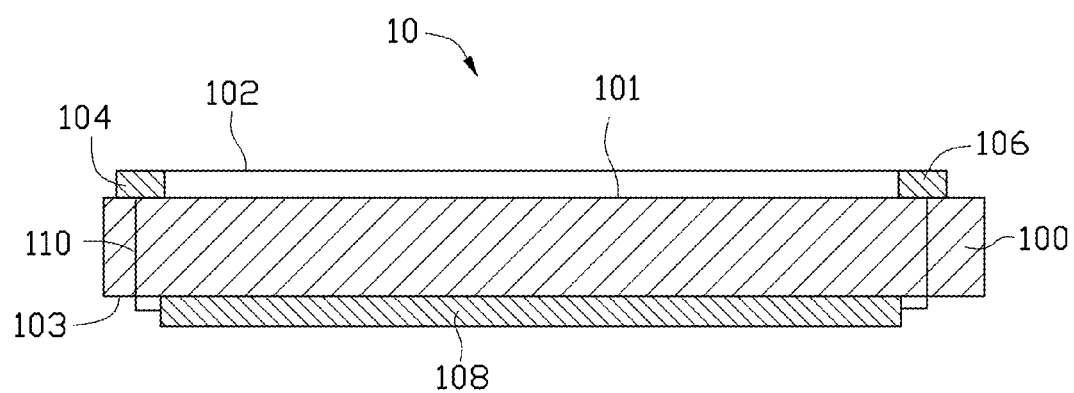
FIG. 1 is a schematic view of a first embodiment of a thermoacoustic chip.

Referring to FIG. 1, a thermoacoustic chip 10 of a first embodiment includes a substrate 100, a sound wave generator 102, a first electrode 104, a second electrode 106, and an integrated circuit (IC) chip 108.

The substrate 100 has a first surface 101 and a second surface 103 opposite to the first surface 101. The first electrode 104 and the second electrode 106 are spaced from each other and electrically connected to the sound wave generator 102. If the substrate 100 is insulative, the first electrode 104 and the second electrode 106 can be located on the first surface 101 of the substrate 100 directly. The sound wave generator 102 can be in contact with the first surface 101 of the substrate 100 or spaced from the first surface 101 of the substrate 100 with the first electrode 104 and the second electrode 106. That is, part of the sound wave generator 102 is suspended by the first electrode 104 and the second electrode 106 and free of contact with any other surface. The IC chip 108 is located on the substrate 100 and electrically connected to the first electrode 104 and the second electrode 106.

The shape of the substrate 100 is not limited, such as round, square, or rectangle. The first surface and the second surface of the substrate 100 can be flat or curved. The size of the substrate 100 can be selected according to need. The area of the substrate 100 can be in a range from about 25 square millimeters to about 100 square millimeters, such as 40 square millimeters, 60 square millimeters, or 80 square millimeters. The thickness of the substrate 100 can be in a range from about 0.2 millimeters to about 0.8 millimeters. Thus, the thermoacoustic chip 10 can meet the demand for miniaturization of the electronic devices, such as mobile phones, computers, headsets or walkman. The material of the substrate 100 is not limited and can be made of flexible materials or rigid materials. In one embodiment, the resistance of the substrate 100 is greater than the resistance of the sound wave generator 102. If the sound wave generator 102 is in contact with the first surface of the substrate 100, the substrate 100 should be made of material with a certain heat-insulating property so that the heat produced by the sound wave generator 102 will not be absorbed by the substrate 100 too quickly. The material of the substrate 100 can be glass, ceramic, quartz, diamond, polymer, silicon oxide, metal oxide, or wood. In one embodiment, the substrate 100 is a square glass plate with a thickness of about 0.6 millimeters and a side length of about 0.8 millimeters. The first surface can be flat.

The sound wave generator 102 has a very small heat capacity per unit area. The heat capacity per unit area of the sound wave generator 102 is less than $2 \times 10^{-4}$ J/cm$^2$*K. The sound wave generator 102 can be a conductive structure with a small heat capacity per unit area and a small thickness. The sound wave generator 102 can have a large specific surface area for generating pressure oscillation in the surrounding medium by the temperature waves generated by the sound wave generator 102. The term "surrounding medium" means the medium outside the sound wave generator 102, and does not include the medium inside of the sound wave generator 102. If the sound wave generator 102 includes carbon nanotubes, the "surrounding medium" does not include the medium inside each carbon nanotube. The sound wave generator 102 can be a free-standing structure. The term "free-standing" includes, but is not limited to, a structure that does not have to be supported by a substrate and can sustain the weight of itself when it is hoisted by a portion thereof without any significant damage to its structural integrity. The suspended part of the sound wave generator 102 will have more sufficient contact with the surrounding medium (e.g., air) to have heat exchange with the surrounding medium from both sides of the sound wave generator 102. The sound wave generator 102 is a thermoacoustic film.

The sound wave generator 102 can be or include a free-standing carbon nanotube structure. The thickness of the carbon nanotube structure may range from about 0.5 nanometers to about 1 millimeter. If the thickness of the carbon nanotube structure is less than 10 micrometers, the carbon nanotube structure has good light transparency. The carbon nanotubes in the carbon nanotube structure are combined by van der Waals attractive force therebetween so that the carbon nanotube structure is free standing and can have at least a part be suspended. The carbon nanotube structure has a large specific surface area (e.g., above 30 m$^2$/g). The larger the specific surface area of the carbon nanotube structure, the smaller the heat capacity per unit area will be. The smaller the heat capacity per unit area, the higher the sound pressure level of the sound produced by the sound wave generator 102.

The carbon nanotube structure can include at least one carbon nanotube film, a plurality of carbon nanotube wires, or a combination of carbon nanotube film and carbon nanotube wires. The carbon nanotube film can be a drawn carbon nanotube film formed by drawing a film from a carbon nanotube array that is capable of having a film drawn therefrom. The heat capacity per unit area of the drawn carbon nanotube film can be less than or equal to about $1.7 \times 10^{-6}$ J/cm$^2$*K. The drawn carbon nanotube film can have a large specific surface area (e.g., above 100 m$^2$/g). In one embodiment, the drawn carbon nanotube film has a specific surface area in the range of about 200 m$^2$/g to about 2600 m$^2$/g. In one embodiment, the drawn carbon nanotube film is a pure carbon nanotube structure consisting of a plurality of carbon nanotubes, and has a specific weight of about 0.05 g/m$^2$.

The thickness of the drawn carbon nanotube film can be in a range from about 0.5 nanometers to about 100 nanometers. If the thickness of the drawn carbon nanotube film is small enough (e.g., smaller than 10 μm), the drawn carbon nanotube film is substantially transparent.

Figure 2:
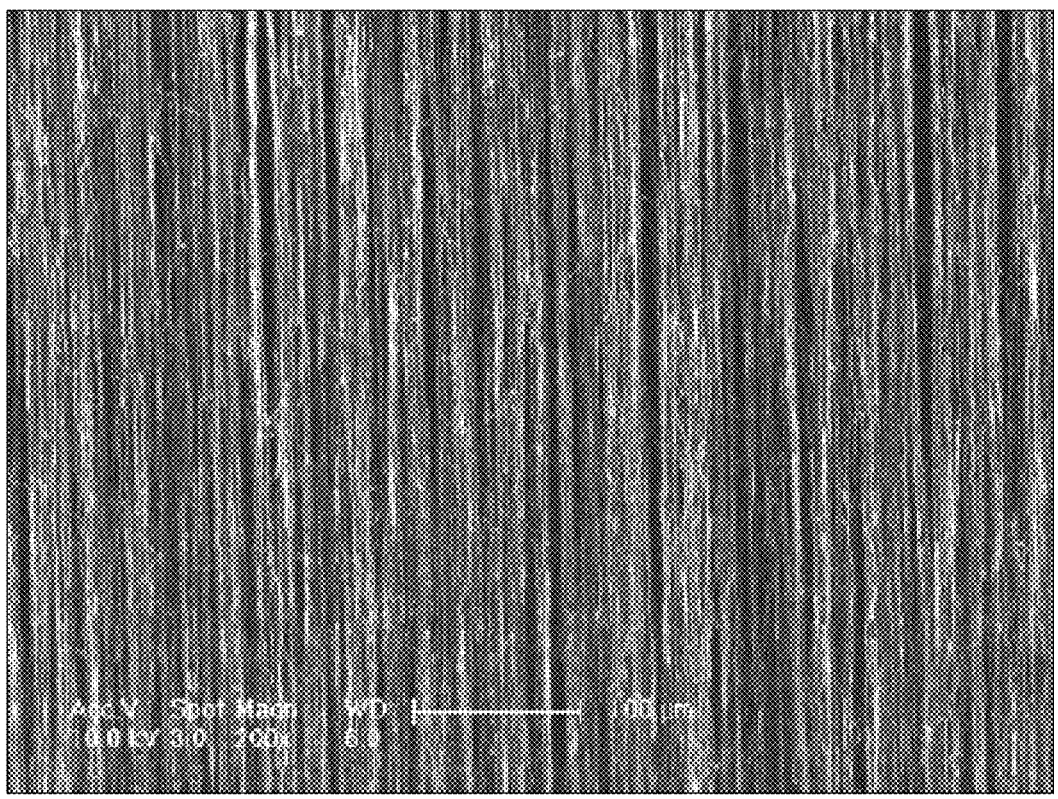
FIG. 2 is a Scanning Electron Microscope (SEM) image of a drawn carbon nanotube film.

Referring to FIG. 2, the drawn carbon nanotube film includes a plurality of successive and oriented carbon nanotubes joined end-to-end by van der Waals attractive force therebetween. The carbon nanotubes in the drawn carbon nanotube film can be substantially oriented along a single direction and substantially parallel to the surface of the carbon nanotube film. Furthermore, an angle β can exist between the oriented direction of the carbon nanotubes in the drawn carbon nanotube film and the extending direction of the plurality of grooves 1222, with 0≤β≤90°. As can be seen in FIG. 2, some variations can occur in the drawn carbon nanotube film. The drawn carbon nanotube film is a free-standing film. The drawn carbon nanotube film can be formed by drawing a film from a carbon nanotube array that is capable of having a carbon nanotube film drawn therefrom.

The carbon nanotube structure can include more than one carbon nanotube film. The carbon nanotube films in the carbon nanotube structure can be coplanar and/or stacked. Coplanar carbon nanotube films can also be stacked one upon other coplanar films. Additionally, an angle can exist between the orientation of carbon nanotubes in adjacent films, stacked and/or coplanar. Adjacent carbon nanotube films can be combined by only the van der Waals attractive force therebetween without the need of an additional adhesive. The number of the layers of the carbon nanotube films is not limited. However, as the stacked number of the carbon nanotube films increases, the specific surface area of the carbon nanotube structure will decrease. A large enough specific surface area (e.g., above 30 m$^2$/g) must be maintained to achieve an acceptable acoustic volume. An angle θ between the aligned directions of the carbon nanotubes in the two adjacent drawn carbon nanotube films can range from about 0 degrees to about 90 degrees. Spaces are defined between two adjacent carbon nanotubes in the drawn carbon nanotube film. If the angle θ between the aligned directions of the carbon nanotubes in adjacent drawn carbon nanotube films is larger than 0 degrees, a microporous structure is defined by the carbon nanotubes in the sound wave generator 102. The carbon nanotube structure in an embodiment employing these films will have a plurality of micropores. Stacking the carbon nanotube films will add to the structural integrity of the carbon nanotube structure.

In one embodiment, the sound wave generator 102 is a single drawn carbon nanotube film drawn from the carbon nanotube array and suspended by the first electrode 104 and the second electrode 106. The drawn carbon nanotube film can be attached on the first electrode 104 and the second electrode 106 by the inherent adhesive nature of the drawn carbon nanotube film or by a conductive bonder. The carbon nanotubes of the drawn carbon nanotube film substantially extend from the first electrode 104 to the second electrode 106. The drawn carbon nanotube film has a thickness of about 50 nanometers, and has a transmittance of visible light in a range from 67% to 95%.

Figure 3:
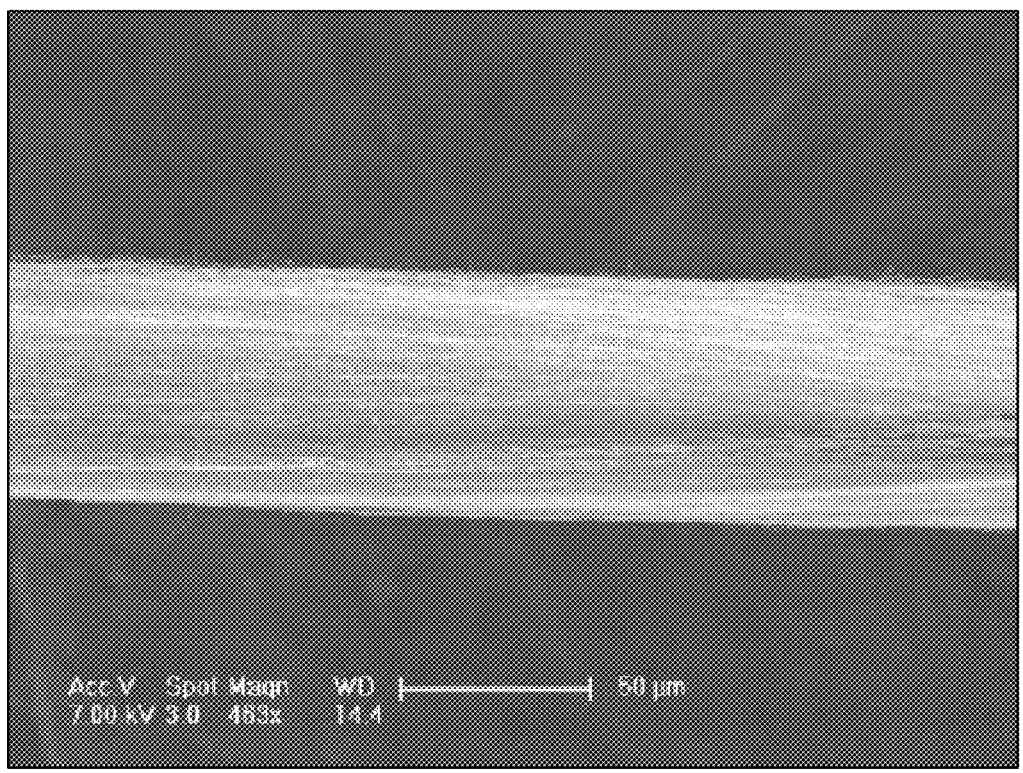
FIG. 3 an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent, such as ethanol, methanol, acetone, ethylene dichloride, or chloroform is applied to soak the entire surface of the drawn carbon nanotube film. During the soaking, adjacent parallel carbon nanotubes in the drawn carbon nanotube film will bundle together, caused by the surface tension of the organic solvent as it volatilizes, and thus, the drawn carbon nanotube film will be shrunk into untwisted carbon nanotube wire. Referring to FIG. 3, the untwisted carbon nanotube wire includes a plurality of carbon nanotubes substantially oriented along one direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 4:
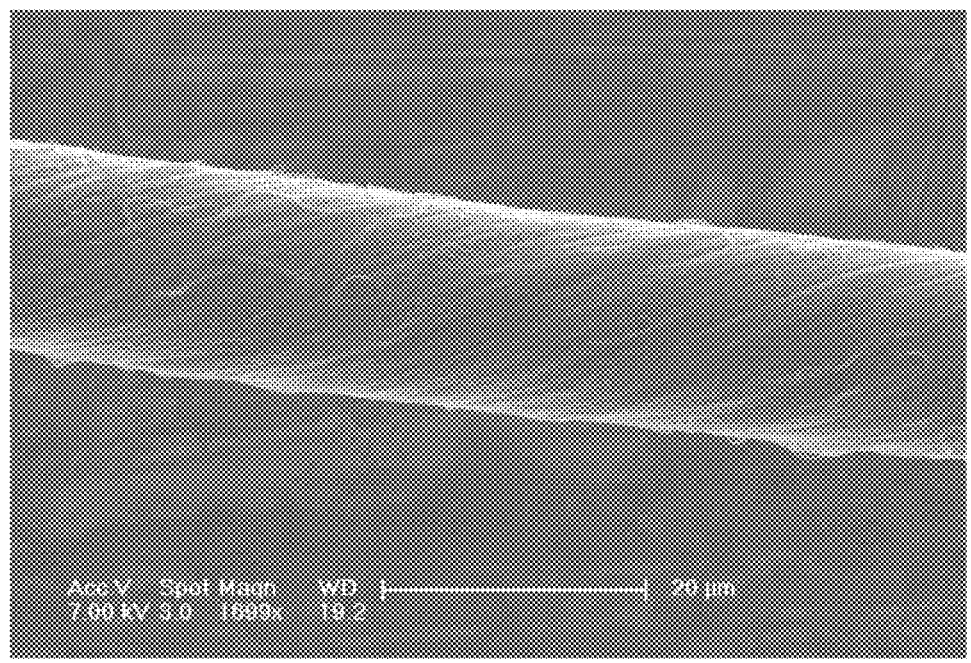
FIG. 4 is an SEM image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 4, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. A length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, caused by the surface tension of the organic solvent when the organic solvent volatilizes. The specific surface area of the twisted carbon nanotube wire will decrease, while the density and strength of the twisted carbon nanotube wire will increase. The deformation of the sound wave generator 110 can be avoided during operation, and the degree of distortion of the sound wave can be reduced.

The first electrode 104 and the second electrode 106 are electrically connected to the sound wave generator 102 and used to input audio signal to the sound wave generator 102. The audio signal is inputted into the carbon nanotube structure through the first electrode 104 and the second electrode 106. The first electrode 104 and the second electrode 106 can be located on the first surface of the substrate 100 or on two supports (not shown) on the substrate 100. The first electrode 104 and the second electrode 106 are made of conductive material. The shape of the first electrode 104 or the second electrode 106 is not limited and can be lamellar, rod, wire, and block, among other shapes. A material of the first electrode 104 or the second electrode 106 can be metals, conductive paste, conductive adhesives, carbon nanotubes, and indium tin oxides, among other conductive materials. The first electrode 104 and the second electrode 106 can be metal wire or conductive material layers, such as metal layers formed by a sputtering method, or conductive paste layers formed by a screen-printing method. In one embodiment, the first electrode 104 and the second electrode 106 are two substantially parallel conductive paste layers.

The IC chip 108 can be located on any surface of the substrate 100 or embedded inside of the substrate 100. The IC chip 108 can be fixed on the substrate 100 with an adhesive, or installed on the substrate 100 with a fastener. The IC chip 108 includes a power amplification circuit for amplifying audio signal and a direct current (DC) bias circuit. Thus, the IC chip 108 can amplify the audio signal and input the amplified audio signal to the sound wave generator 102. Simultaneously, the IC chip 108 can bias the DC electric signal. The shape and size of the IC chip 108 can be selected according to need. The internal structure of the IC chip 108 is simple because the IC chip 108 only plays the function of power amplification and DC bias. The area of the IC chip 108 is less than 1 square centimeters, such as 49 square millimeters, 25 square millimeters, or 9 square millimeters, to meet the demand for miniaturization of thermo acoustic chip 10.

In one embodiment, the IC chip 108 is a packaged IC chip having a plurality of connectors, such as pins or pads. The IC chip 108 can be installed on the substrate 100 with the plurality of connectors or fixed on the substrate 100 by adhesive. The IC chip 108 is electrically connected to the first electrode 104 and the second electrode 106 via conductive wires 110 getting through holes on the substrate 100. When the substrate 100 is conductive, the conductive wires should be coated with insulative layer. In work of the thermoacoustic chip 10, the IC chip 108 input an audio signal to the sound wave generator 102 and the sound wave generator 102 heats surrounding medium intermittently according to the input signal so that the surrounding medium to produce a sound by expansion and contraction.

Figure 5:
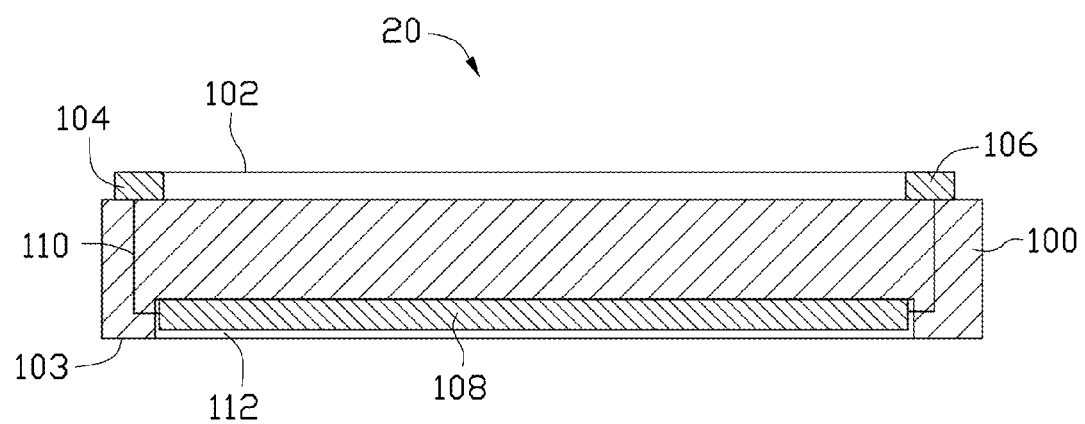
FIG. 5 is a schematic view of a second embodiment of a thermoacoustic chip.

Referring to FIG. 5, a thermoacoustic chip 20 of a second embodiment includes a substrate 100, a sound wave generator 102, a first electrode 104, a second electrode 106, and an IC chip 108.

The thermoacoustic chip 20 is similar to the thermoacoustic chip 10 above except that a recess 112 is formed on the second surface 103 of the substrate 100, and the IC chip 108 is located in the recess 112. The shape and size of the recess 112 is not limited. The shape of the recess 112 can be the same as the shape of the IC chip 108, and the size of the recess 112 can be a little larger than the size of the IC chip 108. The IC chip 108 can be fixed in the recess 112 by an adhesive, or installed in the recess 112 with a fastener. In one embodiment, the substrate 100 is a rectangular resin plate with a length of about 1 centimeter, a width of about 7 millimeters, and a thickness of about 1 millimeter. The recess 112 is formed on the resin plate by punching or stamping. The depth of the recess 112 is a little greater than the thickness of the IC chip 108. Furthermore, a protecting layer (not shown) can be used to cover the recess 112 and package the IC chip 108 inside of the substrate 100. That is, the IC chip 108 can be a naked IC chip and packaged by the substrate 100.

Figure 6:
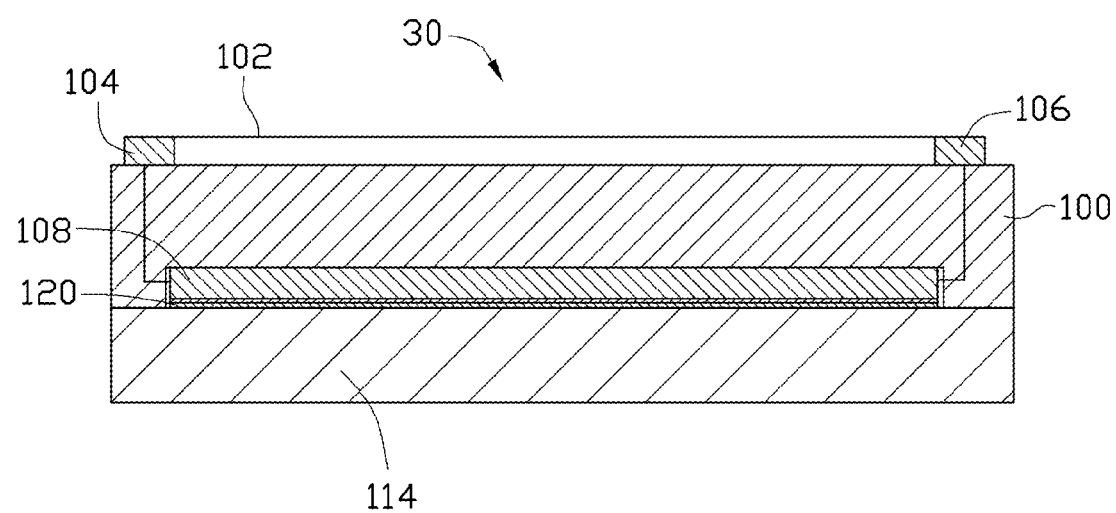
FIG. 6 is a schematic view of a third embodiment of a thermoacoustic chip.

Referring to FIG. 6, a thermoacoustic chip 30 of a third embodiment includes a substrate 100, a sound wave generator 102, a first electrode 104, a second electrode 106, and an IC chip 108.

The thermoacoustic chip 30 is similar to the thermoacoustic chip 20 above except that further include a heat dissipating element 114 in contact with the IC chip 108. The heat dissipating element 114 can be a metal plate, alloy plate, carbon nanotube layer or carbon nanotube array. The shape and size of the heat dissipating element 114 can be selected according to need. Furthermore, a thermal paste layer 120 can be located between the IC chip 108 and the heat dissipating element 114.

Figure 7:
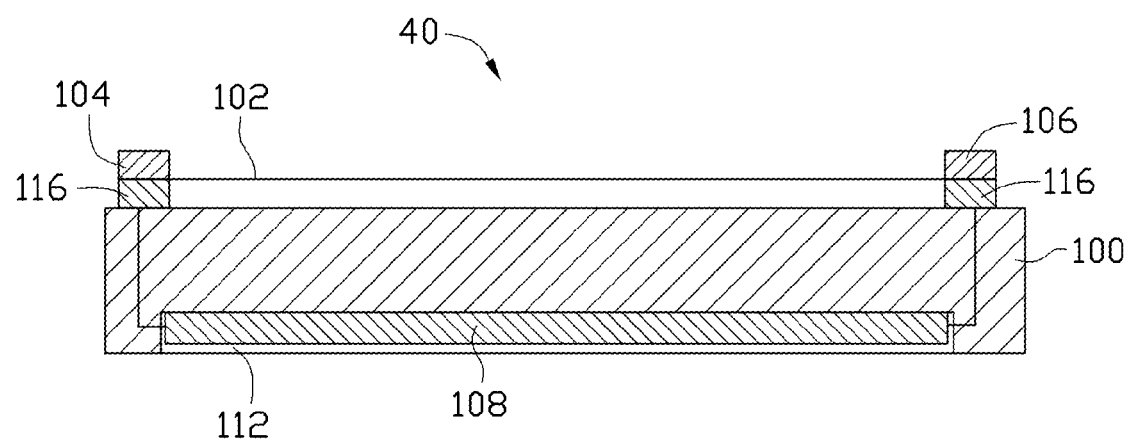
FIG. 7 is a schematic view of a fourth embodiment of a thermoacoustic chip.

Referring to FIG. 7, a thermoacoustic chip 40 of a fourth embodiment includes a substrate 100, a sound wave generator 102, a first electrode 104, a second electrode 106, and an IC chip 108.

The thermoacoustic chip 40 is similar to the thermoacoustic chip 20 above except that the substrate 100 is a metal plate or alloy plate, and the carbon nanotube sound wave generator 102 is suspended above the first surface 101 of the substrate 100 by two insulative elements 116. The first electrode 104 and the second electrode 106 are located on the two insulative elements 116 respectively. The sides of the sound wave generator 102 are sandwiched between the insulative elements 116 and the electrodes 104, 106. The distance between the sound wave generator 102 and the first surface 101 is greater than 100 micrometers, so that the heat produced by the sound wave generator 102 will not be absorbed by the substrate 100 too fast and too much and the sound wave generator 102 can produce sound. Because the metal plate or alloy plate has good thermal conductivity, the substrate 100 can be used to dissipate the heat of the IC chip 108. In one embodiment, the substrate 100 is a rectangular copper plate with a length of about 1 centimeter, a width of about 8 millimeters, and a thickness of about 2 millimeter. The distance between the sound wave generator 102 and the first surface 101 is greater than 200 micrometers.

Figure 8:
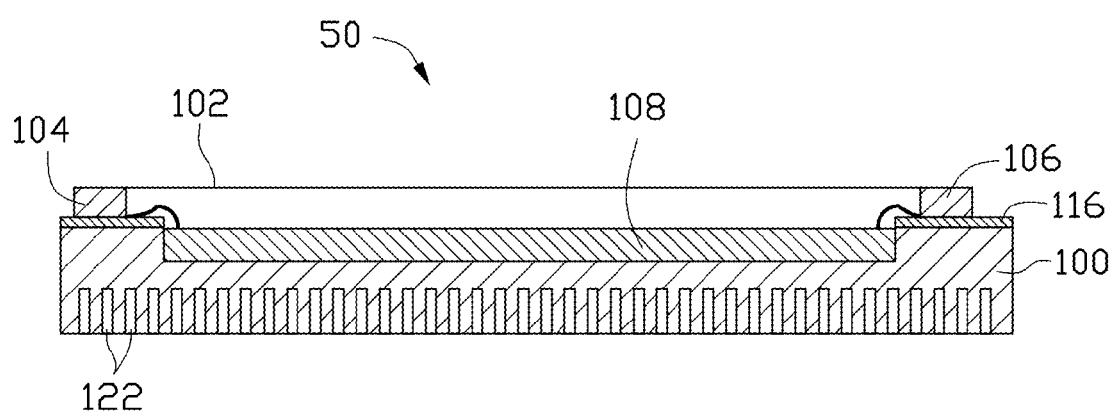
FIG. 8 is a schematic view of a fifth embodiment of a thermoacoustic chip.

Referring to FIG. 8, a thermoacoustic chip 50 of a fifth embodiment includes a substrate 100, a sound wave generator 102, a first electrode 104, a second electrode 106, and an IC chip 108.

The thermoacoustic chip 50 is similar to the thermoacoustic chip 40 above except that a recess 112 is formed on the first surface 101 of the metal or alloy substrate 100, the IC chip 108 is located in the recess 112, and a concave-convex structure 122 is formed on the second surface 103 of the metal or alloy substrate 100 and used to dissipate the heat of the IC chip 108.

In one embodiment, the first surface 101 of the metal or alloy substrate 100 that is around the recess 112 is covered by an insulative element 116. The first electrode 104 and the second electrode 106 are located on the insulative element 116. The sound wave generator 102 is suspended by the first electrode 104 and the second electrode 106. Because the substrate 100 has the concave-convex structure 122, the substrate 100 has large surface to dissipate the heat of the IC chip 108. The shape and size of the concave-convex structure 122 can be selected according to need. In one embodiment, the concave-convex structure 122 is fin-type.

Figure 9:
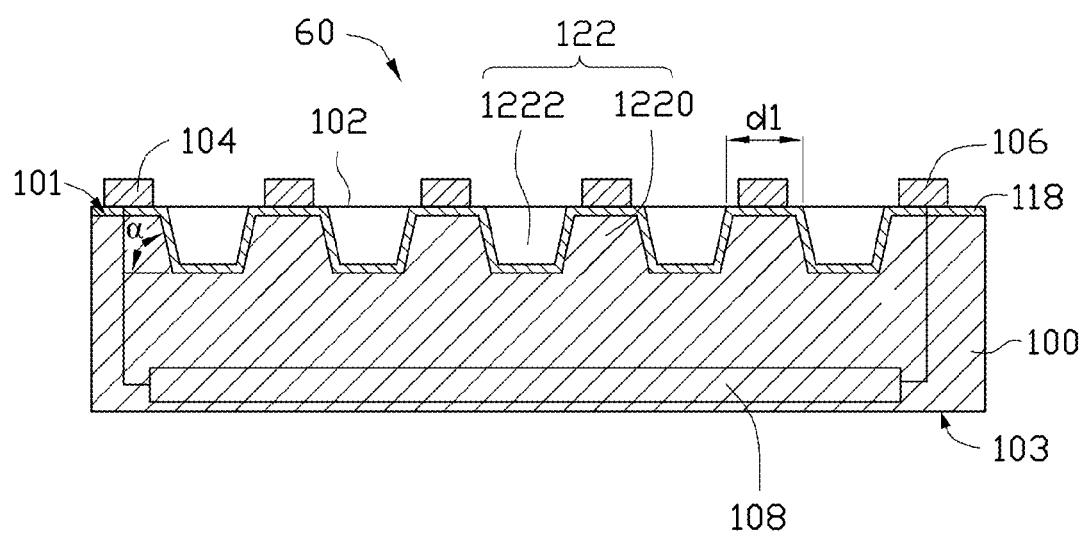
FIG. 9 is a schematic view of a sixth embodiment of a thermoacoustic chip.
Figure 10:
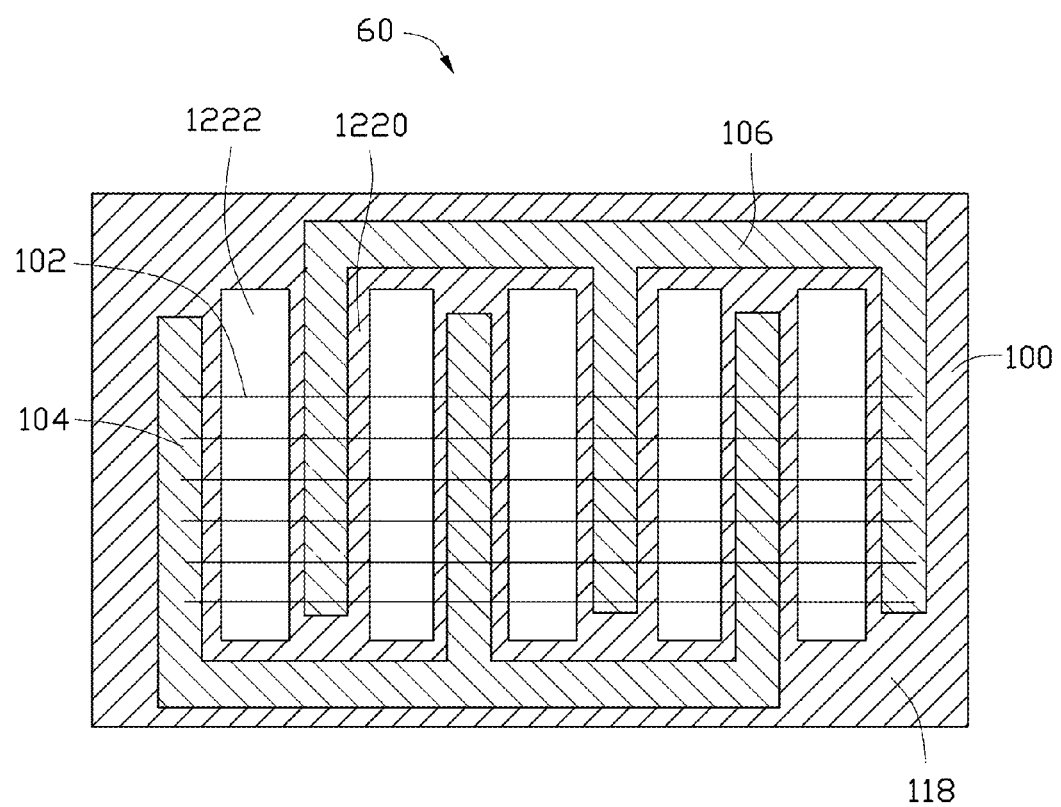
FIG. 10 is a top view of the thermoacoustic chip of FIG. 9.

Referring to FIGS. 9-10, a thermoacoustic chip 60 of a sixth embodiment includes a substrate 100, a sound wave generator 102, a first electrode 104, a second electrode 106, and an IC chip 108.

The thermoacoustic chip 60 is similar to the thermoacoustic chip 10 above except that the substrate 100 is a silicon wafer, the IC chip 108 is directly integrated onto the substrate 100, and the substrate 100 has a concave-convex structure 122 on the first surface 101, and the sound wave generator 102 is suspended over the concave-convex structure 122. Further the thermoacoustic chip 60 includes a plurality of first electrodes 104 and a plurality of second electrodes 106.

The material of the substrate 100 can be monocrystalline silicon or polycrystalline silicon. Thus, the IC chip 108 can be made on the substrate 100 by microelectronics process, such as epitaxial process, diffusion process, ion implantation technology, oxidation process, lithography, etching, or thin film deposition. Thus, the size of the thermoacoustic chip 60 can be smaller to meet the demand for miniaturization and integration of the electronic devices. The concave-convex structure 122 allows the heat produced by the IC chip 108 and the sound wave generator 102 to dissipate fast and in time. The substrate 100 is near the second surface 103. The concave-convex structure 122 can be formed by etching after the IC chip 108 is made on the substrate 100. The carbon nanotubes structure is placed on the concave-convex structure 122. The first electrodes 104 and the second electrodes 106 are formed on the carbon nanotubes structure. Because the process of placing the carbon nanotubes structure and forming the first electrodes 104 and the second electrodes 106 do not involve high temperature process, so the IC chip 108 would not be damaged.

Figure 11:
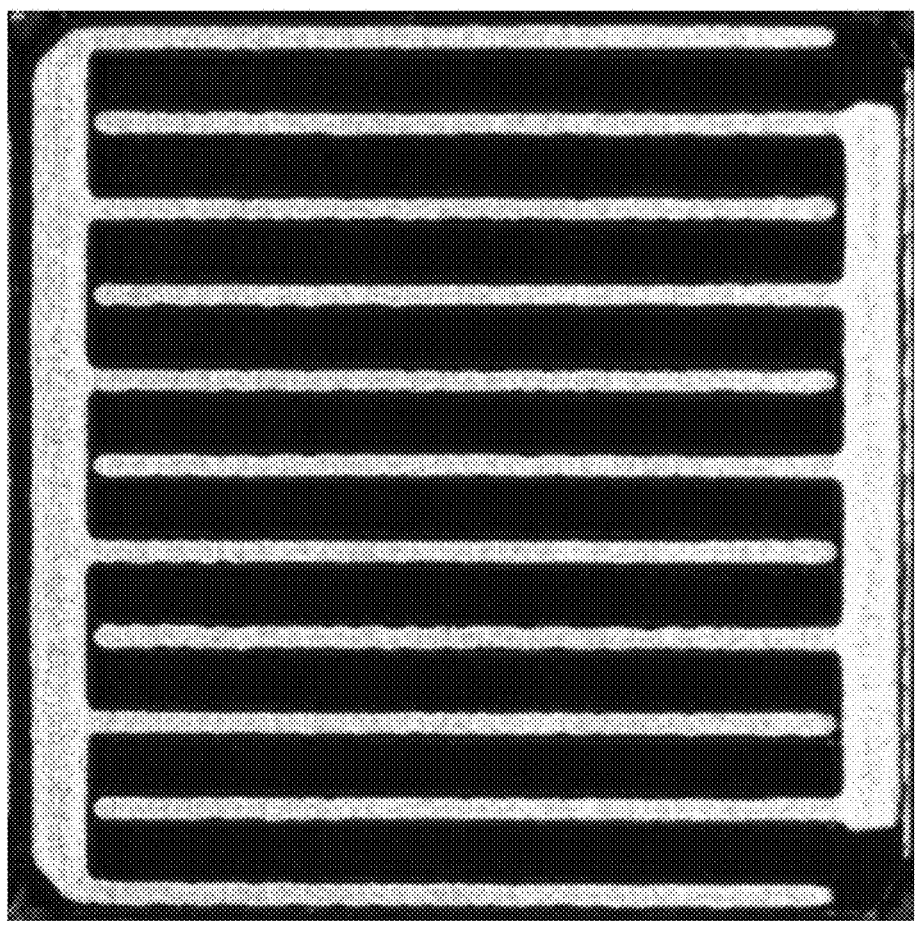
FIG. 11 is an SEM image of the sixth embodiment of the thermoacoustic chip.

The concave-convex structure 122 defines a plurality of grooves 1222 and a plurality of bulges 1220 alternately located. The carbon nanotube structure has a first portion located on the top surface of the plurality of bulges 1220 and a second portion suspended above the plurality of grooves 1222. The plurality of first electrodes 104 and the plurality of second electrodes 106 are alternately located on the top surface of the plurality of bulges 1220. The plurality of first electrodes 104 and the plurality of second electrodes 106 can be located between the carbon nanotube structure and the plurality of bulges 1220, or the carbon nanotube structure can be located between the plurality of bulges 1220 and the plurality of electrodes 104, 106. The plurality of first electrodes 104 are electrically connected to each other to form a comb-shaped first electrode, and the plurality of second electrodes 106 are electrically connected to each other to form a comb-shaped second electrode. As shown in FIG. 11, the tooth of the comb-shaped first electrode and the tooth of the comb-shaped second electrode are alternately located. Thus, the plurality of first electrodes 104, the plurality of second electrodes 106, and the sound wave generator 102 can form a plurality of thermoacoustic units electrically connected to each other in parallel, and the driving voltage of the sound wave generator 102 can be decreased.

The plurality of grooves 1222 can be substantially parallel with each other and extend substantially along the same direction. The length of the plurality of grooves 1222 can be smaller than or equal to the side length of the substrate 100. The depth of the plurality of grooves 1222 can be in a range from about 100 micrometers to about 200 micrometers. The range of depth, the sound wave generator 102 having a certain distance away from the bottom surface of the groove 1222, prevent the heat produced by the sound wave generator 102 from being absorbed by the substrate 100 too quickly, and simultaneously produce good sound at different frequencies. The cross section of each of the plurality of grooves 1222 along the extending direction can be V-shaped, rectangular, or trapezoid. The width (maximum span of the cross section) of each of the plurality of grooves 1222 can be in a range from about 0.2 millimeters to about 1 millimeter. The distance $d_1$ between adjacent grooves 1222 can range from about 20 micrometers to about 200 micrometers. Thus the first electrodes 104 and the second electrodes 106 can be printed on the plurality of bulges 1220 by screen printing. Thus sound wave generator 102 can be protected. Furthermore, a driven voltage of the sound wave generator 102 can be reduced to lower than 12V. In one embodiment, the driven voltage of the sound wave generator 102 is lower than or equal to 5V.

In one embodiment, the substrate 100 is a square monocrystalline silicon wafer with a side length of about 8 millimeters and a thickness of about 0.6 millimeters. The shape of the groove 1222 is a trapezoid. An angle α is defined between the sidewall and the bottom surface of the groove 1222, is equal to the crystal plane angle of the substrate 100. The width of the groove 1222 is about 0.6 millimeters, the depth of the groove 1222 is about 150 micrometers, the distance $d_1$ between adjacent grooves 1222 is about 100 micrometers, and the angle α is about 54.7 degrees.

Furthermore, an insulating layer 118 can be located on the first surface 101 of the substrate 100. The insulating layer 118 can be a single-layer structure or a multi-layer structure. In one embodiment, the insulating layer 118 can be merely located on the top surfaces of the plurality of bulges 1220. In another embodiment, the insulating layer 118 is a continuous structure, and attached on the entire first surface 101. That is, the insulating layer 118 is located on the top surfaces of the plurality of bulges 1220, and the side wall and bottom surface of the plurality of grooves 1222. The insulating layer 118 covers the plurality of grooves 1222 and the plurality of bulges 1220. The sound wave generator 102 is insulated from the substrate 100 by the insulating layer 118. In one embodiment, the insulating layer 118 is a single-layer structure and covers the entire first surface 101. The material of the insulating layer 118 can be $SiO_2$, $Si_3N_4$, or a combination of them. The material of the insulating layer 118 can also be other insulating materials. The thickness of the insulating layer 118 can range from about 10 nanometers to about 2 micrometers, such as about 50 nanometers, about 90 nanometers, and about 1 micrometer. In one embodiment, the thickness of the insulating layer is a single $SiO_2$ layer with a thickness of about 1.2 micrometers.

In one embodiment, the sound wave generator 102 includes a plurality of carbon nanotube wires substantially parallel with and spaced from each other. The extending direction of the plurality of carbon nanotube wires and the extending direction of the plurality of grooves 1222 are substantially perpendicular with each other. Each of the plurality of carbon nanotube wire includes a plurality of carbon nanotubes substantially oriented along a direction along the length of the carbon nanotube wire. Part of the plurality of carbon nanotube wires are suspended over the plurality of grooves 1222. That is, the suspended parts of the plurality of carbon nanotube wires are free of contact with any other surface. The distance between adjacent carbon nanotube wires can be in a range from about 1 micrometer to about 200 micrometers. In one embodiment, the distance between adjacent carbon nanotube wires is in a range from about 50 micrometers to about 150 micrometers. In one embodiment, the distance between adjacent carbon nanotube wires is about 120 micrometers, and the diameter of the plurality of carbon nanotube wires is about 1 micrometer.

In one embodiment, the plurality of carbon nanotube wires can be made by the following steps:

step (10), laying a carbon nanotube film on the first electrode 104 and the second electrode 106, wherein the carbon nanotubes of the carbon nanotube film extend substantially along a direction perpendicular with the extending direction of the first electrode 104 and the second electrode 106;

step (12), forming a plurality of carbon nanotube belts in parallel with and spaced from each other by cutting the carbon nanotube film along the extending direction of the carbon nanotubes of the carbon nanotube film by a laser; and step (13), shrinking the plurality of carbon nanotube belts by treating with organic solvent, wherein the organic solvent can be dripped on the plurality of carbon nanotube belts.

In step (12), the width of the carbon nanotube belt is in a range from about 20 micrometers to about 50 micrometers so that the carbon nanotube belt can be shrunk into carbon nanotube wire completely. If the width of the carbon nanotube belt is too great, after the shrinking process, the carbon nanotube wire will have rips therebetween which will affect the sound produced by the carbon nanotube wire. If the width of the carbon nanotube belt is too small, the strength of the carbon nanotube wire will be too small which will affect the life span of the carbon nanotube wire.

Figure 12:
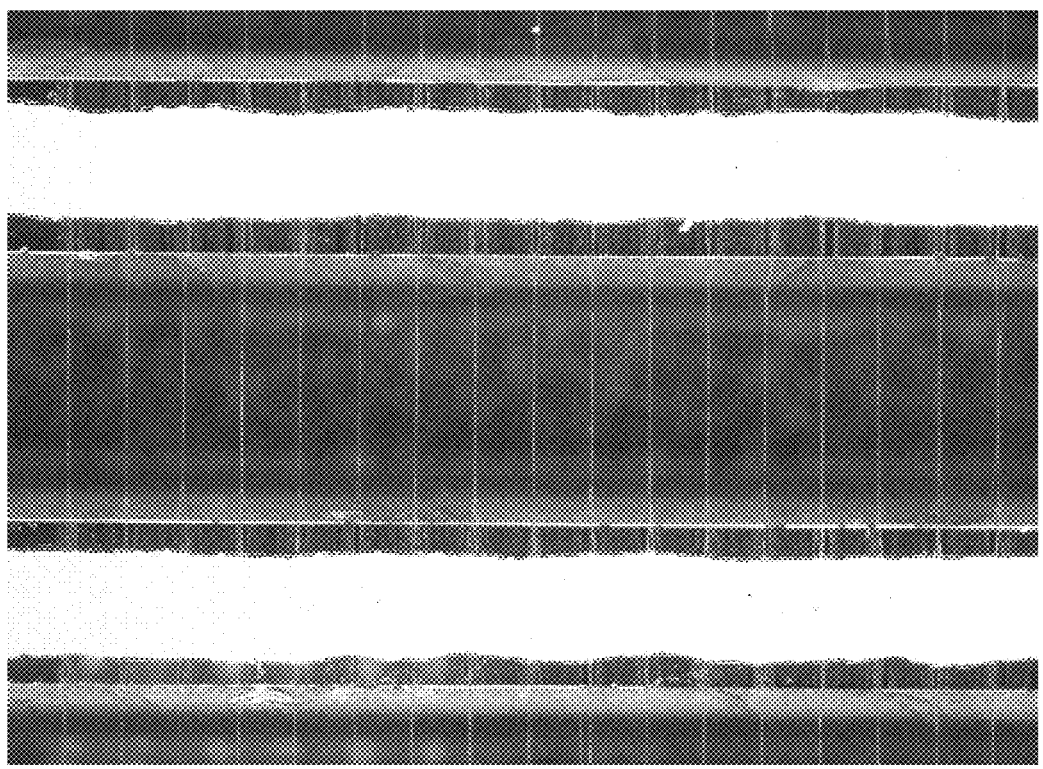
FIG. 12 is an optical microscope image of a plurality of carbon nanotube wires of the tenth embodiment of the thermoacoustic chip.

In step (13), the plurality of carbon nanotube belts is shrunk to form the plurality of carbon nanotube wires (the dark portion is the substrate 100, and the white portions are the first electrode 104 and the second electrode 106) as shown in FIG. 12. The two opposite ends of the plurality of carbon nanotube wires are electrically connected to the first electrode 104 and the second electrode 106. The diameter of the carbon nanotube wires ranges from about 0.5 micrometers to about 3 micrometers. In one embodiment, the width of the carbon nanotube belt is about 30 micrometers, the diameter of the carbon nanotube wire is about 1 micrometer, and the distance between adjacent carbon nanotube wires is about 120 micrometers.

After treating the carbon nanotube belts, the driven voltage between the first electrode 104 and the second electrode 106 can be reduced. During the shrinking process, a part of the plurality of carbon nanotube belts attached on the plurality of bulges 1220 will not be shrunk by the organic solvent so that the plurality of carbon nanotube wires have a greater contact surface with the first electrode 104 and the second electrode 106. Thus after being shrunk, this part of the plurality of carbon nanotube wires can be firmly fixed on the bulges 104, and electrically connected to the first electrode 104 and the second electrode 106. Furthermore, after the shrinking process, the suspended part of the carbon nanotube wires are tightened and can prevent the sound produced by the carbon nanotube wire from being distorted.

Figure 13:
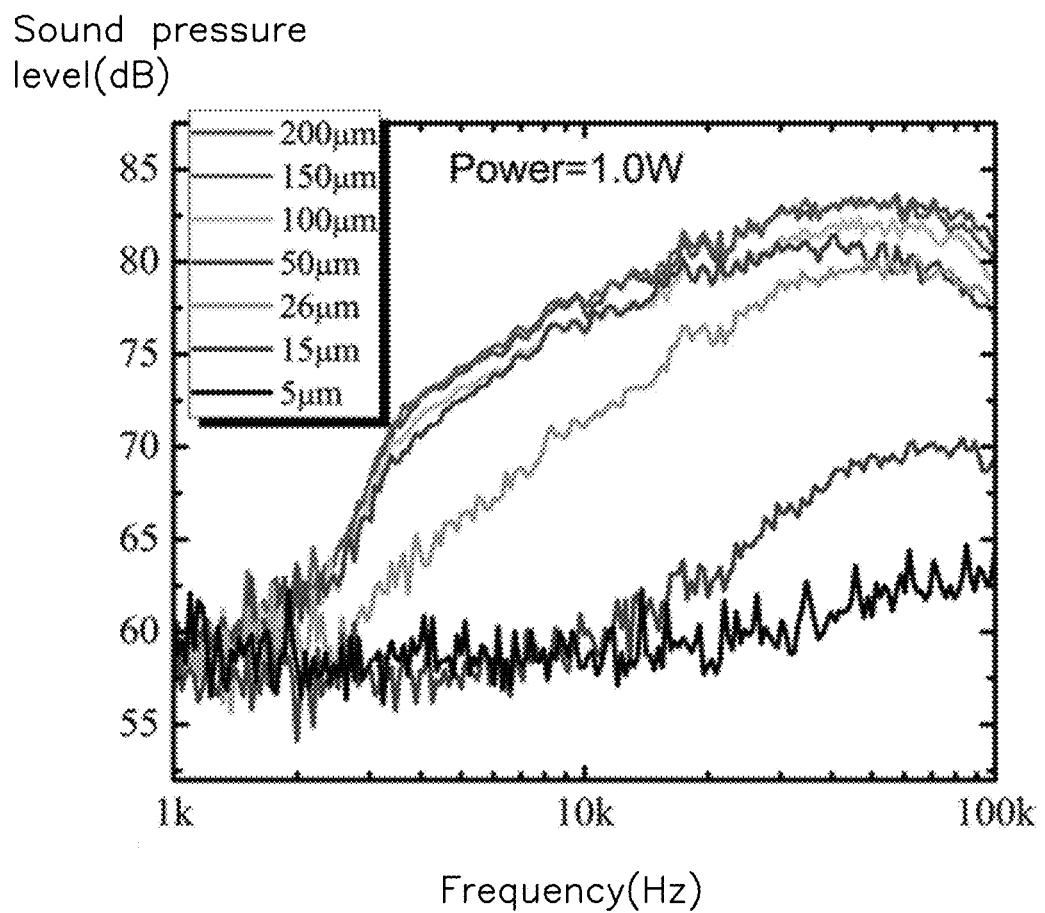
FIG. 13 shows a sound pressure level-frequency curve of the sixth embodiment of the thermoacoustic chip.
Figure 14:
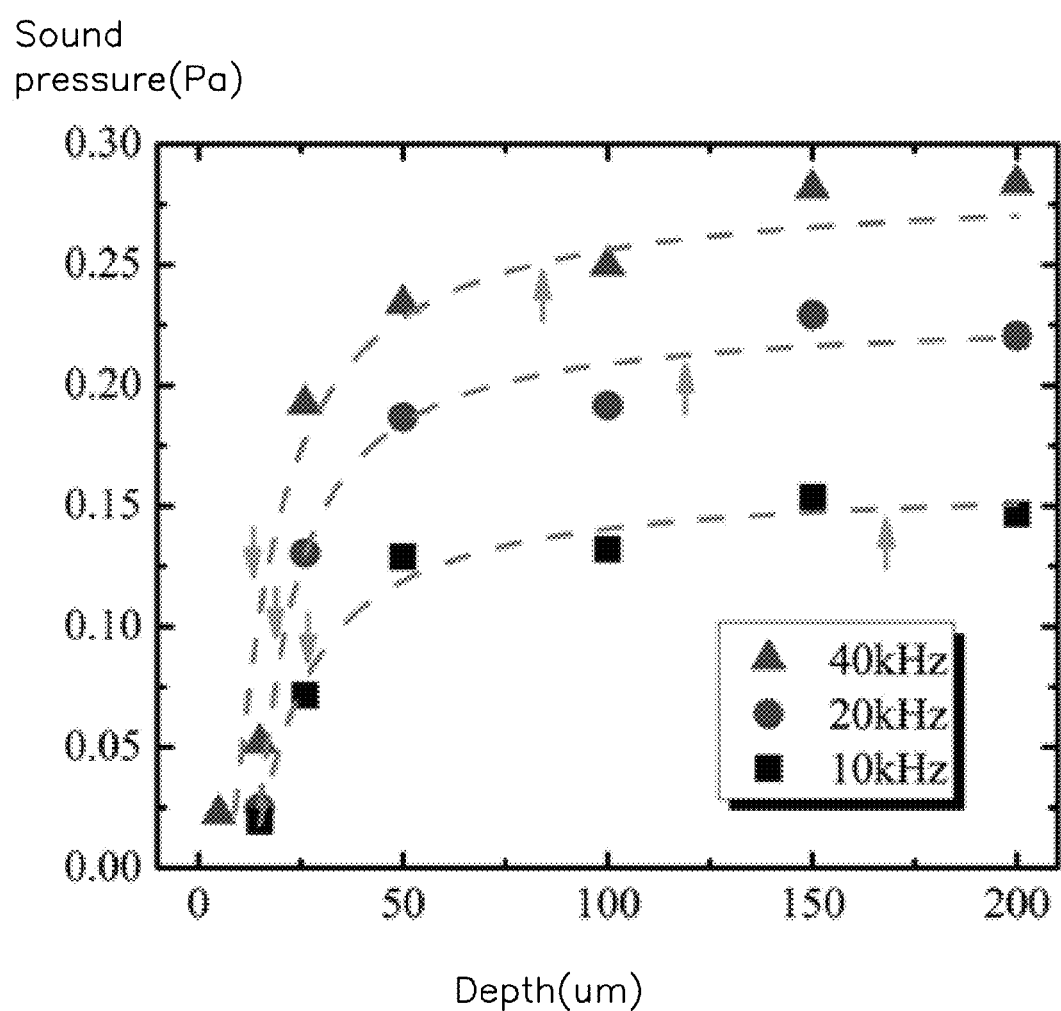
FIG. 14 shows a schematic view of the acoustic effect of the sixth embodiment of the thermoacoustic chip.

Referring to FIGS. 13-14, the sound effect of the thermoacoustic chip 60 is related to the depth of the plurality of grooves 1222. In one embodiment, the depth of the plurality of grooves 1222 ranges from about 100 micrometers to about 200 micrometers. Thus, in the frequency band for which the human can hear, the thermoacoustic chip 60 have excellent thermal wavelength. Therefore, the thermoacoustic chip 60 still has good sound effects despite its small size.

In use, the thermoacoustic chip can be located inside of the electronic devices directly, such as mobile phones, computers, headsets or walkman, and electrically connected to the circuit of the electronic devices easily.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. The above-described embodiments illustrate the disclosure but do not restrict the scope of the disclosure.

What is claimed is:

1. A thermoacoustic chip comprising:
   a substrate having a first surface and a second surface opposite to the first surface;
   a sound wave generator located on the first surface of the substrate;
   a first electrode and a second electrode;
   an insulating layer located on the first surface of the substrate and sandwiched between the substrate and the sound wave generator so that the first electrode, the second electrode, and the sound wave generator are insulated from the substrate by the insulating layer; and
   an integrated circuit chip located on the substrate and electrically connected to the first electrode and the second electrode, wherein the first electrode and the second electrode are spaced from each other and electrically connected to the sound wave generator; wherein the substrate defines a recess on one of the first surface and the second surface, and the integrated circuit chip is located in the recess and not fully enclosed by the substrate.

2. The thermoacoustic chip of claim 1, wherein the substrate comprises a material selected from the group consisting of glass, ceramic, quartz, diamond, polymer, silicon oxide, metal oxide, and wood.

3. The thermoacoustic chip of claim 1, wherein the substrate is a silicon wafer, and the integrated circuit chip is directly integrated onto the substrate.

4. The thermoacoustic chip of claim 1, wherein the substrate is a metal plate or alloy plate, the sound wave generator is suspended above the first surface of the substrate by two insulative elements.

5. The thermoacoustic chip of claim 4, wherein the substrate defines the recess on the first surface and a concave-convex structure on the second surface, and the integrated circuit chip is located in the recess.

6. The thermoacoustic chip of claim 1, wherein the substrate defines the recess on the second surface, and the integrated circuit chip is located in the recess.

7. The thermoacoustic chip of claim 1, wherein the integrated circuit chip comprises a power amplification circuit and a direct current bias circuit.

8. The thermoacoustic chip of claim 1, wherein the sound wave generator comprises a free-standing carbon nanotube structure, and a part of the carbon nanotube structure is suspended.

9. The thermoacoustic chip of claim 8, wherein the carbon nanotube structure comprises a plurality of carbon nanotubes joined end-to-end and arranged substantially along a same direction.

10. The thermoacoustic chip of claim 8, wherein the carbon nanotube structure comprises a plurality of carbon nanotube wires spaced from and in parallel with each other, and each of the plurality of carbon nanotube wires comprises a plurality of carbon nanotubes oriented substantially along a direction along a length of each of the plurality of carbon nanotube wires or helically oriented around an axial direction of each of the plurality of carbon nanotube wires.

11. The thermoacoustic chip of claim 1, wherein the substrate is a silicon wafer and defining a concave-convex structure comprising a plurality of grooves and a plurality of bulges alternately located, and the sound wave generator has a first portion located on top surfaces of the plurality of bulges and a second portion suspended above the plurality of grooves.

12. The thermoacoustic chip of claim 11, wherein a width of the each of the plurality of grooves is in a range from about 0.2 millimeters to about 1 millimeter.

13. The thermoacoustic chip of claim 11, wherein a depth of each of the plurality of grooves is in a range from about 100 micrometers to about 200 micrometers.

14. The thermoacoustic chip of claim 11, wherein the plurality of grooves are in parallel and spaced from each other, and a distance between adjacent two of the plurality of grooves is in a range from about 20 micrometers to about 200 micrometers.

15. The thermoacoustic chip of claim 14, wherein the sound wave generator is a free-standing carbon nanotube structure comprising a plurality of carbon nanotubes extending substantially along a direction substantially perpendicular with the plurality of grooves.

16. The thermoacoustic chip of claim 11, further comprising a plurality of first electrodes and a plurality of second electrodes, the plurality of first electrodes and a plurality of second electrodes are located on the plurality of bulges and in parallel with the plurality of grooves.

\* \* \* \* \*